(12) United States Patent
Zhang et al.

(10) Patent No.: US 11,933,835 B2
(45) Date of Patent: Mar. 19, 2024

(54) FAULT LOCATION METHOD, SYSTEM AND APPLICATION OF TWO-LEVEL VSC TYPE PHOTOVOLTAIC CONNECTED BIDIRECTIONAL FLEXIBLE DC DISTRIBUTION NETWORK

(71) Applicant: China University of Petroleum (East China), Qingdao (CN)

(72) Inventors: Zhihua Zhang, Qingdao (CN); Mingming Sun, Qingdao (CN); Yongtao Tian, Qingdao (CN); Hao Wang, Qingdao (CN); Kun Wang, Qingdao (CN); Chengmin Liu, Qingdao (CN)

(73) Assignee: CHINA UNIVERSITY OF PETROLEUM (EAST CHINA), Qingdao (CN)

( * ) Notice: Subject to any disclaimer, the term of this patent is extended or adjusted under 35 U.S.C. 154(b) by 0 days.

(21) Appl. No.: 18/207,516

(22) Filed: Jun. 8, 2023

(65) Prior Publication Data

US 2023/0400498 A1    Dec. 14, 2023

(30) Foreign Application Priority Data

Jun. 8, 2022    (CN) .......................... 202210643052.5

(51) Int. Cl.
G01R 31/08    (2020.01)
(52) U.S. Cl.
CPC ......... *G01R 31/086* (2013.01); *G01R 31/088* (2013.01)
(58) Field of Classification Search
CPC ............................ G01R 31/086; G01R 31/088
(Continued)

(56) References Cited

U.S. PATENT DOCUMENTS

2021/0382103 A1*  12/2021  Rajapakse ............ G01R 31/085

FOREIGN PATENT DOCUMENTS

| CN | 110672972 A | 1/2020 |
| CN | 111289843 A | 6/2020 |

(Continued)

OTHER PUBLICATIONS

Gao, Xiaoping et al., "Transient Current Based Fault Location Method of Pole-to-pole Short-circuit for Modular Multilevel Converter Low-voltage Direct Current," Automation of Electric Power Systems, Sep. 10, 2020, pp. 127-135, vol. 44, Issue No. 17.

*Primary Examiner* — Farhana A Hoque
(74) *Attorney, Agent, or Firm* — Muncy, Geissler, Olds & Lowe, P.C.

(57) ABSTRACT

The present invention relates to the technical field of fault location of distributed energy resources connected flexible DC distribution network, and disclosed a fault location method, system and application of bipolar short-circuit of two-level VSC-type photovoltaic-connected flexible DC distribution network, wherein, directions of positive currents of DC feeders during fault are used to locate a fault section; a bipolar short-circuit distance measurement model covering interactions and responses of systems is established according to equivalent circuits of transient periods; and fault location is done by obtaining a distance to fault with electric parameters and information of the fault. With the technical solutions offered in the present invention, accurate location of the fault can be done with the electric parameters and information of the fault, a key technology is provided for quick location of bipolar short-circuit of flexible DC distribution network, power supply reliability of the system is further improved, errors due to differentiation of the conventional distance measurement methods are effectively avoided, the location results are more accurate and of high stability, in this way, further development of flexible DC (Continued)

distribution network can be promoted and building of a new power system in the background of energy transition is facilitated.

2 Claims, 5 Drawing Sheets

(58) Field of Classification Search
USPC .................................................. 324/500–600
See application file for complete search history.

(56) References Cited

FOREIGN PATENT DOCUMENTS

| JP | 2003-072431 A | 3/2003 |
|---|---|---|
| WO | WO 2018/094862 A1 | 5/2018 |

\* cited by examiner

FAULT LOCATION METHOD, SYSTEM AND APPLICATION OF TWO-LEVEL VSC TYPE PHOTOVOLTAIC CONNECTED BIDIRECTIONAL FLEXIBLE DC DISTRIBUTION NETWORK

TECHNICAL FIELD

The present invention belongs to the technical field of fault location for flexible DC distribution network of distributed energy resources, specifically relates to a fault location method, system and application of two-level VSC type photovoltaic-connected bidirectional flexible DC distribution network.

BACKGROUND TECHNOLOGY

Flexible direct current distribution network (abbreviated as flexible DC distribution network) is characterized in high running efficiency, big electricity supply radius, good power quality, high reliability, strong controllability and convenience for high ratio connection of distributed energy resources, and has thus become an important part of the new power system. Two-level voltage sources convertors (VSC) are key devices for building the flexible DC distribution network, two-level VSCs have simple structures and involve low cost, and with the gradual development of the SiC power devices, the application prospect of the two-level VSCs in the field of low voltage flexible DC distribution networks grows broader. In the meanwhile, with the continuous increase of penetration of the photovoltaic power, photovoltaic connected flexible DC distribution network based on two-level VSC has attracted wide concern in the academic community domestic and abroad. DC side bipolar short circuit fault of the flexible DC distribution network has the most serious damage on the system, to locate the fault accurately is a premise to promise safe and reliable operation of the system; however, bipolar faults of VSC type flexible DC distribution network are characterized in high current rising speed, big magnitude and numerous influencing elements, and have brought enormous challenges to fault location technologies. Existing flexible DC distribution network fault location methods can be divided as per principles into the travelling wave fault location method, the fault injection method and fault analysis. The travelling wave fault location method calculates the distance to fault by recognizing the surge of the travelling wave and measuring time difference for travelling from the measuring point to the fault and is widely used in DC power transmission lines. However, the travelling wave fault location method has a high requirement on the sampling frequency and distance measurement accuracy is subject to influences from factors such as surge recognition and wave speed calculation. The fault injection method calculates the distance to the fault by installing additional auxiliary devices while taking precautions and forming a discharging circuit in combination with the DC network, however, installation of the auxiliary devices makes this method not advantageous economically. In the meanwhile, both the foregoing methods have certain limitations on the line length, as lines of low and medium voltage flexible DC distribution networks are usually short, the application of the foregoing two methods in fault location of two-level VSC flexible DC distribution network is significantly restricted. The fault analysis method locates the fault in the flexible DC distribution networks by expressing the relationship between the distance to the fault and the electric data, with the present method, transient fault information can be directly used, no additional signal injection device is required additionally, and the location accuracy by the fault analysis method is not interrelated to the line length, so the fault analysis method is appropriate for fault location in flexible DC distribution network based on two-level VSC(s). However, the transient full-process analysis model for bipolar short circuit of two-level VSC flexible DC distribution network is not accurate enough, and covers usually only transient output characteristics of the two-level VSC(s), and neglects the coupling relationship between the AC system and the distributed energy resources (DERs) at the fault point, when the existing fault analysis method is directly used in fault location there may be some errors. Furthermore, the flexible DC distribution network location method based on the conventional fault analysis method conducts fault location with the information at a certain time section and in the corresponding model, information utilization is not full, and it is difficult to promise the robustness of the location method. What's more, in the conventional location methods, usually the difference of the sampling values between two points is taken as the differentiation for the midpoint time, the average value is taken as the transient value at the midpoint time, and the substitution error brought by the present method will influence the location accuracy. Therefore, a new fault location method for distributed energy resources connected flexible DC distribution networks is urgently desired.

In view of the foregoing analysis, it can be known the problems and deficiencies with the prior art are that: the transient full-process analysis model of two-level VSC flexible DC distribution network bipolar short circuit is not accurate enough, and covers usually only transient output characteristics of the two-level VSC, and neglects the coupling relationship between the AC system and the distributed energy resources (DERs) at the fault point, when the existing fault analysis method is directly used in fault location there may be some errors. Furthermore, the flexible DC distribution network location method based on the conventional fault analysis method conducts fault location with the information at a certain time section and in the corresponding model, information utilization is not full, and it is difficult to promise the robustness of the location method. What's more, in the conventional location method, usually the difference of the sampling values between two points is taken as the differentiation for the midpoint time, the average value is taken as the transient value at the midpoint time, and the substitution error brought by the present method will influence the location accuracy.

Difficulty in addressing the foregoing problems and deficiencies lies in that: internal structures of the convertors during fault conditions are complex, it is necessary to analyze conduction conditions of internal diodes in the convertors in different sub-systems, divide the bipolar short circuit fault into different transient stages, and it remains blank as to principles for division of stages and building of fault analysis models in different transient periods. In the meantime, the structures for two-level VSC photovoltaic connected flexible DC distribution networks are complex, the order of the distance measurement mode equation in each of the transient stages of the fault condition is quite high, thus the difficulty to obtain a solution of the location result is big.

Significance in addressing the foregoing problems and deficiencies: the two-level VSC type photovoltaic connected bidirectional flexible DC distribution network is a typical topological structure, given the coupling relationship between the at least one photovoltaic sub-system and the At least one AC sub-system during the bipolar short circuit fault period, to build an accurate distance measuring model for transient stages during the DC side bipolar short circuit fault period and realize fault location with electric parameters and information of the fault for the two-level VSC type flexible DC distribution network provides a key technique for quick location of the flexible DC distribution network bipolar short circuit fault, and can improve reliability of the power supply system to a further extent, contribute to further development of the flexible DC distribution network and assist in building of a new power system in the background of energy transition.

SUMMARY OF THE INVENTION

To overcome the problems existing in the prior art, the embodiments of the present invention provide a fault location method and system for two-level VSC type photovoltaic connected bidirectional flexible DC distribution network, and relates especially to a method, system, medium, device and terminal for two-level VSC photovoltaic connected bidirectional flexible DC distribution network bipolar short circuit fault based on parameter recognition. The technical solutions are as following:

The present invention is realized in the following manner: a fault location method for two-level VSC type photovoltaic connected flexible DC distribution network, wherein the fault location method for two-level VSC-type photovoltaic connected flexible DC distribution network comprising:

Recognizing a section where a fault lie from a direction of positive current of DC feeders during a fault period; establishing a distance measuring model for bipolar short circuit covering interactions and responses of systems according to equivalent circuits of transient periods during the fault period; and realizing fault location by finding a distance to fault with electric parameters and information of the fault.

Further, the fault location method of two-level VSC-type photovoltaic connected bidirectional flexible DC distribution network comprising the following steps:

Step 1, assuming a T point is an intersection between a DC feeder of a at least one photovoltaic sub-system and a DC feeder of an At least one AC sub-system, judging the section where the fault occurs according to the direction of the positive current of the DC feeders at the T point during the fault period;

Step 2, establishing a distance measurement model for the bipolar short circuit fault covering the interactions and responses between the systems by the equivalent circuits of transient periods during bipolar short circuit of the two-level VSC type flexible DC distribution network;

Step 3, determining a length of a sampling window according to boundary conditions of the transient periods of the fault, calculating the distance to the fault based on electric parameters and information of the fault at sampling times; calculating average values of the distance to the fault obtained at the sampling points and realizing accurate location of the bipolar short circuit fault.

In an embodiment, in the step 1, a direction from convertors of the At least one AC sub-system or the at least one photovoltaic sub-system to a DC circuit is a positive direction, $i_{VSC1}$, $i_{VSC2}$, $i_{DC/DC}$ are respectively positive currents between the T point and output of VSC1, VSC2 and DC/DC at the T point, if during the fault period, $i_{VSC1}$ is negative, the fault is located in between the VSC1 and the T point; if during the fault period, $i_{VSC2}$ is negative, the fault is located in between the VSC2 and the T point; and if during the fault period $i_{DC/DC}$ is negative, the fault is located in between the DC/DC and the T point.

In an embodiment, in the step 2, after occurrence of the fault, turning off immediately IGBTs of the convertors of the sub-systems, analyzing coupling relationships of each of the subsystems at a fault point during the fault period according to conduction and feeding conditions of internal diodes in two-level VSCs and photovoltaic DC/DC, determining boundary conditions and the equivalent circuits of the transient stages during the bipolar short circuit fault; building a corresponding fault mode equation based on Kirchhoff's laws; expressing elements in the fault mode equation that change along with the distance to the fault and transitional resistance and establishing a bipolar short circuit fault distance measurement mode equation containing the distance to the fault and the transitional resistance.

In an embodiment, in the step 3, based on the fault distance measurement equation, acquiring electric values of variables in different states at the same sampling time, forming an object optimization issue under multiple constraints according to the least square method, and obtaining the distance to the fault at the corresponding sampling time by finding solution for the equation.

Determining starting time and ending time of each of the transient stages according to the boundary conditions of the transient periods during the fault period, a difference between the starting time and the ending time is the length of the sampling window; based on the electric parameters and information of the fault, building the object optimization issue at the same sampling time under multiple constraints according to the least square method:

$$\min\{[\chi_1(t_i, x, R_g) - \chi_1(t_i)]^2 + [\chi_2(t_i, x, R_g) - \chi_2(t_i)]^2 + \\ \ldots + [\chi_k(t_i, x, R_g) - \chi_k(t_i)]^2 + \ldots + [\chi_n(t_i, x, R_g) - \chi_n(t_i)]^2\}$$

$$\text{subject to } \begin{cases} [\chi_1(t_i, x, R_g) - \chi_1(t_i)] \le \xi \\ [\chi_2(t_i, x, R_g) - \chi_2(t_i)] \le \xi \\ \ldots \\ [\chi_k(t_i, x, R_g) - \chi_k(t_i)] \le \xi \\ \ldots \\ [\chi_n(t_i, x, R_g) - \chi_n(t_i)] \le \xi \\ 0 \le x \le l \\ 0 \le R_g \le R_{g\text{-}max} \end{cases}$$

Calculating the distances to the fault at different sampling times by finding solution of the equation; calculating an average value for the distances to the fault for a plurality of sampling points, so as to realize accurate location of the bipolar short circuit fault;

$$x_{av} = \frac{1}{n}\sum_{i=1}^{n} x_i$$

Another purpose of the present invention is to provide a fault location system for two-level VSC-type photovoltaic connected bidirectional flexible DC distribution network by applying the foregoing fault location method for two-level VSC-type photovoltaic connected bidirectional flexible DC distribution network, wherein the fault location system for the two-level VSC-type photovoltaic connected bidirectional flexible DC distribution network comprising:

a fault segment judging module, configured to judge the fault section assuming a T node is an intersection between at least one DC side feeder of the at least one photovoltaic sub-system and at least one DC feeder of the At least one AC sub-system according to the direction of the positive current of each of the DC feeders at the T node during the fault period;

a fault distance measurement model building module, configured to establish a bipolar short circuit fault distance measurement model covering interactions and responses of each of the systems by equivalent circuits of the transient stages of the fault;

a fault distance calculation module, configured to determine the length of the sampling window based on the boundary conditions of the transient stages of the fault, and calculating the distances to the fault at different sampling times based on the electric parameters and information of the fault; and a short circuit fault location module, calculating the average values for the distances to the faults calculated at different sampling points and realizing accurate location of the bipolar short circuit fault.

Another purpose of the present invention is to provide a storage medium for a program that can receive users' input, wherein a computer program is stored and can have an electronic device to execute any of the following steps:

realizing identification of a fault section according to directions of positive currents of DC feeders during a fault period; establishing a fault distance measurement model for bipolar short circuit covering interactions and responses between systems based on equivalent circuits of transient phases; and locating the fault by find a solution of a distance to the fault with electric parameters and information of the fault.

Another purpose of the present invention is to provide a computer device, wherein the computer device comprises a storage device and a processor, a computer program is stored in the storage device, and the computer program when executed by the processor will have the processor execute the following steps:

realizing identification of a fault section according to directions of positive currents of DC feeders during a fault period; establishing a fault distance measurement model for bipolar short circuit covering interactions and responses between systems based on equivalent circuits of transient phases; and locating the fault by find a solution of a distance to the fault with electric parameters and information of the fault.

Another purpose of the present invention is to provide a computer readable medium, wherein a computer program is stored, wherein the computer program when executed by a processor will have the processor to execute the following steps:

realizing identification of a fault section according to directions of positive currents of DC feeders during a fault period; establishing a fault distance measurement model for bipolar short circuit covering interactions and responses between systems based on equivalent circuits of transient phases; and locating the fault by find a solution of a distance to the fault with electric parameters and information of the fault.

Yet another purpose of the present invention is to provide an information and data processing terminal, wherein the information and data processing terminal is configured to provide a user input interface to execute the fault location system of two-level VSC-type photovoltaic connected bidirectional flexible DC distribution network when executed in an electronic device.

In view of all the foregoing technical solutions, the advantages and positive effects of the present invention are:

First of all, targeting at the technical problems existing in the prior art and the difficulties in addressing the technical problems, in light of the technical solutions claimed in the present invention and the results and data obtained during development and researches, how the technical solutions in the present invention have solved the technical problems and also the inventive technical effects brought after addressing the technical problems has been analyzed in detail and thoroughly. Specifically:

Compared with conventional fault location methods, the fault location method for bipolar short circuit of two-level VSC-type photovoltaic-connected bidirectional flexible DC distribution network based on parameter recognition has significant differences:

1. In conventional fault location methods, the coupling relationship between the feeders of the AC system and the photovoltaic system at the fault point has not been considered and the location accuracy is poor when photovoltaic access capacity is big. The fault location method for bipolar short circuit of two-level VSC-type photovoltaic-connected bidirectional flexible DC distribution network based on parameter recognition has considered the coupling relationship between each of the sub-systems at the fault point, and built a fault distance measurement model for bipolar short circuit covering interactions and responses of the systems, which results in higher location accuracy.

2. Conventional fault location methods use the difference between two sampling points as the differentiation at the midpoint moment, and use average values as the transient values at the midpoint time, consequently, the location accuracy is subject to influence of the length of the sampling windows and the sampling frequency. The fault location method for bipolar short circuit of two-level VSC-type photovoltaic-connected bidirectional flexible DC distribution network based on parameter recognition does not need to consider errors resulted from the replacement of the differentiation, in the meanwhile, accuracy can be promised in a small data window, therefore, the accuracy is better and also is the stability.

Secondly, the present invention proposed a fault location method for bipolar short circuit of two-level VSC-type photovoltaic-connected bidirectional flexible DC distribution network based on parameter recognition, with the present method the section where the fault occurs can be identified correctly, accurate location of the fault can be realized with the electric parameters and information of the fault, the error due to differentiation of conventional distance measurement methods is effectively addressed, the location result is more accurate and the stability is better.

Thirdly, as auxiliary evidence of the inventiveness of the claims of the present invention, the present invention provides a key technique for rapid location of bipolar short circuit of flexible DC distribution network, can improve the reliability of the power supply system to a further extent, is contributive to the further development of flexible DC distribution network, and assist in building of a new power system in the background of energy transition.

BRIEF DESCRIPTION OF DRAWINGS

Hereinafter the drawings are incorporated into the description and form a part thereof, the drawings exhibit embodiments in compliance with the present disclosure and are intended to explain the principles of the present disclosure together with the description.

EMBODIMENTS

To make the purposes, features and advantages of the present invention more clear and apparent, hereinafter a detailed description will be given to the embodiments of the present invention. In the following description, many specific details are given to help to fully understand the present invention. However, the present invention can be implemented in many ways other than those described here, and those skilled in the art can make similar improvements without departing from the contents of the present invention, therefore the present invention is not subject to limitations of the specific embodiments disclosed herein.

I Explanatory and Illustrative Embodiments

Figure 1:
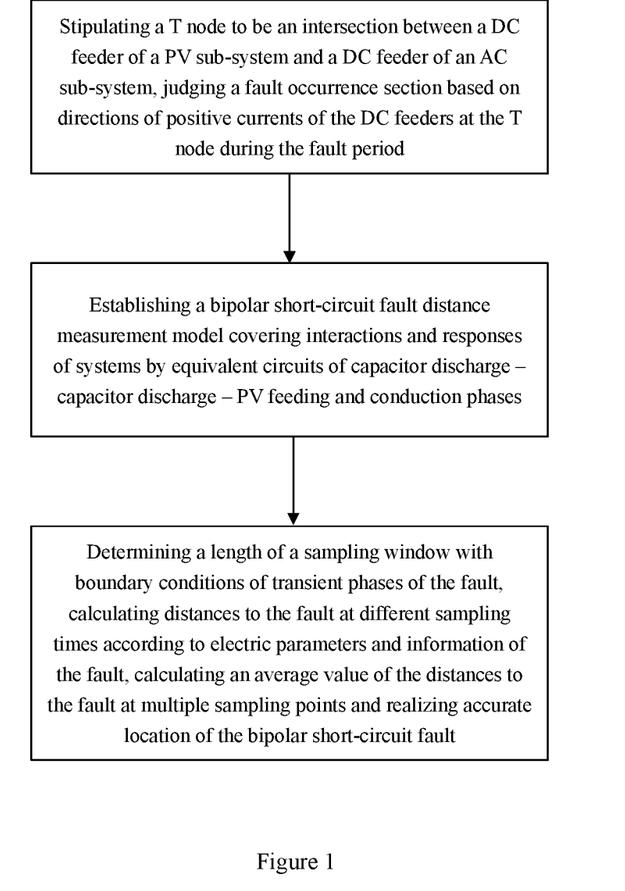
FIG. 1 is a flowchart diagram showing a fault location method of two-level VSC-type photovoltaic-connected bidirectional flexible DC distribution network provided in an embodiment of the present invention.

As shown in FIG. 1, a fault location method for two-level VSC-type photovoltaic-connected bidirectional flexible DC distribution network comprises the following steps:

S101, stipulating a T node to be an intersection of a DC side feeder of a at least one photovoltaic sub-system and a DC side feeder of an At least one AC sub-system, judging a fault occurrence section according to directions of positive currents of the DC feeders at the T node during a fault period;

S102, establishing a distance measurement model for bipolar short circuit fault covering interactions and responses of systems by equivalent circuits of transient stages;

S103, determining a length of a sampling window according to boundary conditions of the transient stages of the fault, obtaining the distances to the fault at different sampling times based on electrical parameters and information of the fault; and calculating an average value of the distances to the fault obtained at the different sampling points and realizing accurate location of the bipolar short circuit fault.

Figure 2:
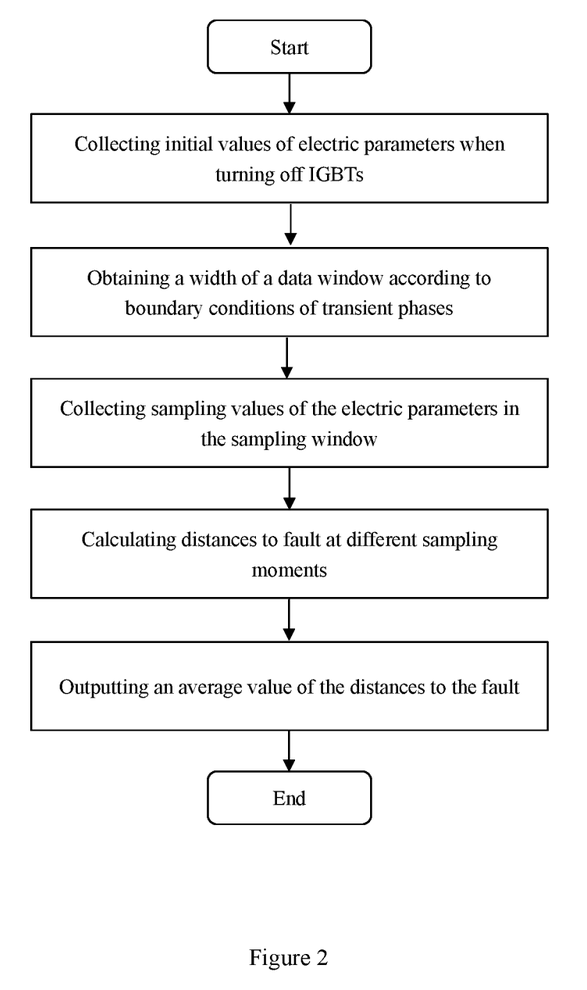
FIG. 2 is a diagram showing principles of the fault location method of two-level VSC-type photovoltaic-connected bidirectional flexible DC distribution network provided in an embodiment of the present invention.

As shown in FIG. 2, the fault location method of two-level VSC-type photovoltaic-connected bidirectional flexible DC distribution network provided in an embodiment of the present invention takes use of the direction of the positive current of each of the DC feeders during the fault period to recognize the fault occurrence section; also a distance measurement model for the bipolar short circuit fault covering interactions and responses of the systems is built according to equivalent circuits of the transient stages during the fault period, and the electrical parameter information of the fault are used to calculate the distance to the fault and realize accurate location of the fault. Specific contents of the technical solutions used in the present embodiment of the present invention are as following:

1. Stipulating that the T node is the intersection of the DC side feeder of the at least one photovoltaic sub-system and the DC side feeder of the At least one AC sub-system, the direction from the At least one AC sub-system or the at least one photovoltaic sub-system to the DC circuit is a positive direction, $i_{VSC1}$, $i_{VSC2}$, and $i_{DC/DC}$ are respectively positive currents between the T node and the VSC1, VSC2 and DC/DC output, judging the fault occurrence section according to the direction of the positive current of each of the DC feeders at the T node during the fault period. If during the fault period $i_{VSC1}$ is negative, the fault occurs in between the VSC1 and the T node; if during the fault period $i_{VSC2}$ is negative, the fault occurs in between the VSC2 and the T node; and if during the fault period $i_{DC/DC}$ is negative, the fault occurs in between the DC/DC and the T node.

2. After occurrence of the fault, IGBTs of convertors of the sub-systems are immediately turned off, determining the boundary conditions of the transient stages during bipolar short circuit fault and equivalent circuits thereof according to conduction and feeding conditions of internal diodes in the two-level VSCs and the photovoltaic DC/DC and in consideration of the coupling relationship of the sub-system at the fault point during fault, establishing a bipolar short circuit fault mode equation containing the distance to the fault and the transitional resistance, and building a bipolar short circuit fault distance measurement model covering the interactions and responses of the systems.

3. Determining the length of the sampling window according to the boundary conditions of the transient stages of the fault, collecting electrical values of state variables at the same sampling moment based on the fault distance measurement mode equation, forming an object optimization issue under multiple restraints according to the least square method, calculating the distances to the fault at different sampling times according to parameters and information on the electrical values of the fault, calculating an average value of the distances to the fault at the multiple sampling points and realizing accurate location of the bipolar short circuit fault.

Figure 3:
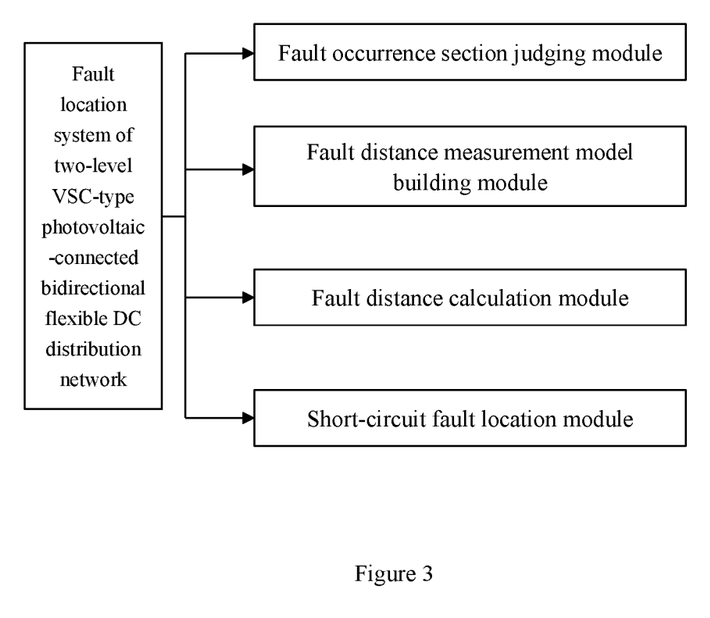
FIG. 3 is a structural diagram showing a fault location system of two-level VSC-type photovoltaic-connected bidirectional flexible DC distribution network provided in an embodiment of the present invention.

As shown in FIG. 3, the fault location system for two-level VSC-type photovoltaic-connected bidirectional flexible DC distribution network provided in an embodiment of the present invention comprising:

a fault occurrence section judging module 1, configured to stipulate a T node to be an intersection between a DC side feeder of a at least one photovoltaic sub-system and a DC side feeder of an At least one AC sub-system, and judging the fault occurrence section according to a direction of a positive current of each of the DC feeders at the T node during a fault period;

a fault distance model building module 2, configured to build a bipolar short circuit fault distance measurement model covering interactions and responses of systems with equivalent circuits of all transient phases;

a fault distance calculation module 3, configured to determine a length of a sampling window according to boundary conditions of all transient phases of the fault and calculating the distances to fault at different sampling times according to parameters and information of electrical values of the fault;

a short circuit fault location module 4, configured to calculate an average value of the distances to the fault obtained at different sampling points and realize accurate location of the bipolar short circuit fault.

Embodiment 2

The present invention proposes a fault location method for bipolar short circuit of two-level VSC-type photovoltaic-connected bidirectional flexible DC distribution network, and a general flowchart diagram of the fault location process is shown in FIG. 2. Hereinafter the present invention will be further explained in detail in conjunction with a two-level VSC-type photovoltaic-connected bidirectional flexible DC distribution network instance and the drawings.

As a preferred embodiment, as shown in FIG. 2, the fault location method of two-level VSC-type photovoltaic-connected bidirectional flexible DC distribution network comprises specifically the following steps:

1. Fault Location Start Judgment

When a bipolar short circuit fault occurs to the two-level VSC-type photovoltaic-connected bidirectional flexible DC distribution network, the fault current rises rapidly, and when the DC side current rises to be three times of the rated current, the IGBTs in the convertors of the systems are quickly turned off, the fault location is started and in the meanwhile, values of electric parameters at the moment of turning off are collected.

2. Fault Section Recognition

Stipulating a T node to be an intersection between the DC side feeder of the at least one photovoltaic sub-system and the DC side feeder of the At least one AC sub-system, a direction from the convertors of the At least one AC sub-system or the at least one photovoltaic sub-system to the DC circuits is a positive direction, $i_{VSC1}$, $i_{VSC2}$ and $i_{DC/DC}$ are respectively the positive currents between the T node and the outputs of the VSC1, VSC2 and DC/DC flowing through the T node, and judge the fault occurrence section according to the directions of the positive currents of the DC feeders at the T node. If at the fault period, $i_{VSC1}$ is negative, the fault occurs in between the VSC1 and the T node; if during the fault period, $i_{VSC2}$ is negative, the fault occurs in between the VSC2 and the T node; and if during the fault period, $i_{DC/DC}$ is negative, the fault occurs in between the DC/DC and the T node.

3. Transient Stages and Data Window Recognition

Take as an example capacitor discharge—capacitor discharge—photovoltaic feeding and conduction stages during the bipolar short-circuit fault, when the capacitance voltage at the DC side of the AC system satisfies $u_{dc}(t)=0$, the transient period of capacitor discharge ends. Furthermore, when the capacitance voltage at the DC side of the photovoltaic system is reduced to zero, the photovoltaic feeding and conduction period ends. According to the boundary conditions of the transient periods, the period that the capacitor discharge—capacitor discharge—photovoltaic feeding and conduction periods of the bipolar short-circuit fault of the two-level VSC-type photovoltaic-connected bidirectional flexible DC distribution network last can be determined. Suppose $t_{VSC1}$ and $t_{VSC2}$ are respectively the ending moments of the capacitor discharge periods after occurrence of the fault of VSC1 and VSC2, and $t_{DC/DC}$ is the ending moment of the photovoltaic feeding and conduction period of the photovoltaic system. The ending moment of the capacitor discharge—capacitor discharge—photovoltaic feeding and conduction period is $t=\min\{t_{VSC1}, t_{VSC2}, t_{DC/DC}\}$. The data required for the fault location method provided in the present invention are the electric parameters at the period from the turning off of the IGBTs of the convertors to the ending moment of the capacitor discharge—capacitor discharge—photovoltaic feeding and conduction period, and according to the ending moment of the capacitor discharge—capacitor discharge—photovoltaic feeding and conduction period the duration of the transient process can be determined and the width of the corresponding data window can be obtained.

4. Distance Measurement Model Building

Figure 4:
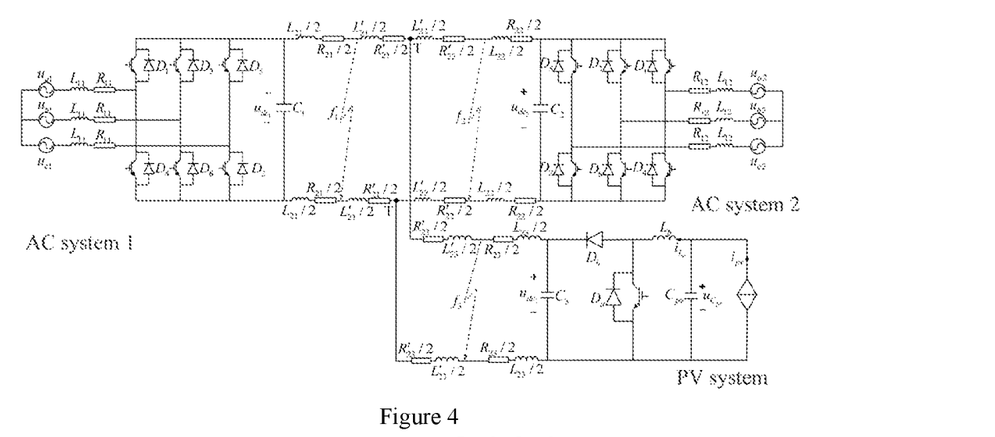
FIG. 4 is a topological diagram showing a bipolar short circuit fault of two-level VSC-type photovoltaic-connected bidirectional flexible DC distribution network according to an embodiment of the present invention.
Figure 5:
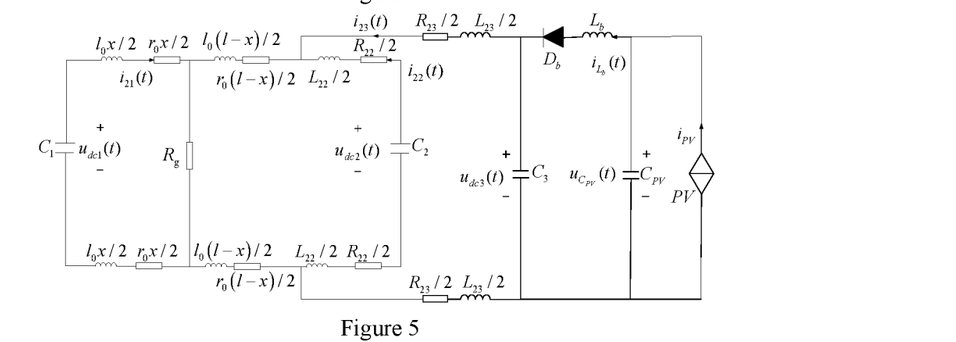
FIG. 5 is an equivalent circuit diagram showing capacitor discharging-capacitor discharging-photovoltaic feeder conduction phases according to an embodiment of the present invention.

The topological diagram of the bipolar short-circuit fault of the two-level VSC-type photovoltaic-connected bidirectional flexible DC distribution network is shown in FIG. 4, take as an example that the bipolar short-circuit fault occurs at $f_1$, suppose the unit resistance and electrical inductance of the DC circuit is $r_0$ and $l_0$, the line length between the VSC1 and the T node is 1, the distance to fault is x, take as an example the capacitor discharge—capacitor discharge—photovoltaic feeding and conduction period of the bipolar short-circuit, the equivalent circuit is shown in FIG. 5. As can be seen in FIG. 5, the state equation of the present period is: wherein $$\dot{x}_1 = \begin{bmatrix} A_{111} \\ A_{112} \end{bmatrix} x_1 + B_1$$

$$x_1 = \begin{bmatrix} u_{dc1} & u_{dc2} & u_{dc3} & u_{c_{pv}} & i_b & i_{21} & i_{22} & i_{23} \end{bmatrix}^T,$$

$$\dot{x}_1 = \begin{bmatrix} \dfrac{du_{dc1}}{dt} & \dfrac{du_{dc2}}{dt} & \dfrac{du_{dc3}}{dt} & \dfrac{du_{c_{pv}}}{dt} & \dfrac{di_b}{dt} & \dfrac{di_{21}}{dt} & \dfrac{di_{22}}{dt} & \dfrac{di_{23}}{dt} \end{bmatrix}^T$$

-continued $$A_{111} = \begin{bmatrix} 0 & 0 & 0 & 0 & -\frac{1}{C_1} & 0 & 0 & 0 \\ 0 & 0 & 0 & 0 & 0 & -\frac{1}{C_2} & 0 & 0 \\ 0 & 0 & 0 & 0 & 0 & 0 & -\frac{1}{C_3} & \frac{1}{C_3} \\ 0 & 0 & 0 & \frac{k_i}{C_{pv}} & 0 & 0 & 0 & -\frac{1}{C_{pv}} \\ 0 & 0 & -\frac{1}{L_b} & \frac{1}{L_b} & 0 & 0 & 0 & 0 \end{bmatrix}$$

$$A_{112} = \begin{bmatrix} \frac{1}{l_0 x} & 0 & 0 \\ 0 & \frac{L_{23} + l_0(l-x)}{M} & -\frac{l_0(l-x)}{M} \\ 0 & -\frac{l_0(l-x)}{M} & \frac{L_{22} + l_0(l-x)}{M} \\ 0 & 0 & 0 \\ -\frac{r_0 x + R_g}{l_0 x} & -\frac{L_{23} R_g}{M} & -\frac{L_{22} R_g}{M} \\ -\frac{R_g}{l_0 x} & -\frac{L_{23}[R_{22} + r_0(l-x) + R_g] + L_{24} R_{22}}{M} & \frac{l_0(l-x)R_{22} - L_{22}[r_0(l-x) + R_g]}{M} \\ -\frac{R_g}{l_0 x} & \frac{l_0(l-x)R_{23} - L_{23}[r_0(l-x) + R_g]}{M} & -\frac{L_{22}[R_{23} + r_0(l-x) + R_g] + l_0(l-x)R_{23}}{M} \\ 0 & 0 & 0 \end{bmatrix}$$

$$M = L_{22}L_{23} + L_{22}L'_{21} + L_{23}L'_{21},$$

$$B_1 = \begin{bmatrix} 0 & 0 & 0 & \frac{p_i}{C_{pv}} & 0 & 0 & 0 & 0 \end{bmatrix}^T,$$

$$i_{PV} = k_i u_{C_{PV}} + p_i$$

For a fixed photovoltaic-connected bidirectional flexible DC distribution network, the parameters such as system unit resistance is fixed, when $r_g$ and x are fixed, according to the classic fourth-order Runge-Kutta method, the state equation can be used to solve the values of the electric parameters at any moment.

5. Fault Location Method Calculation

Collect sequentially the values of the electric parameters at the time of $t_i$, namely $u_{dc1}(t_i)$, $u_{dc2}(t_i)$, $u_{dc3}(t_i)$, $u_{C_{pv}}(t_i)$, $i_{21}(t_i)$, $i_{22}(t_i)$ and $i_{23}(t_i)$ According to the least squares method, a problem of object optimization under multiple constraints can be formed.

$$\min \begin{cases} [u_{dc1}(t_i, x, R_g) - u_{dc1}(t_i)]^2 + [u_{dc2}(t_i, x, R_g) - u_{dc2}(t_i)]^2 + \\ [u_{dc3}(t_i, x, R_g) - u_{dc3}(t_i)]^2 + \\ [u_{C_{pv}}(t_i, x, R_g) - u_{C_{pv}}(t_i)]^2 + [i_b(t_i, x, R_g) - i_b(t_i)]^2 + \\ [i_{21}(t_i, x, R_g) - i_{21}(t_i)]^2 + \\ [i_{22}(t_i, x, R_g) - i_{22}(t_i)]^2 + [i_{23}(t_i, x, R_g) - i_{23}(t_i)]^2 \end{cases}$$

subject to 
$$\begin{cases} [u_{dc1}(t_i, x, R_g) - u_{dc1}(t_i)] \le \xi \\ [u_{dc2}(t_i, x, R_g) - u_{dc2}(t_i)] \le \xi \\ [u_{dc3}(t_i, x, R_g) - u_{dc3}(t_i)] \le \xi \\ [u_{C_{pv}}(t_i, x, R_g) - u_{C_{pv}}(t_i)] \le \xi \\ [i_b(t_i, x, R_g) - i_b(t_i)] \le \xi \\ [i_{21}(t_i, x, R_g) - i_{21}(t_i)] \le \xi \\ [i_{22}(t_i, x, R_g) - i_{22}(t_i)] \le \xi \\ [i_{23}(t_i, x, R_g) - i_{23}(t_i)] \le \xi \\ 0 \le x \le l \\ 0 \le R_g \le R_{g,max} \end{cases}$$

by solving the equation, the distance to the fault x, can be obtained at the time of $t_i$. Similarly, the corresponding distance to the fault at the multiple sampling points in the data window can be calculated and the average value of the several distances to the fault is used as the final distance measurement result.

$$x_{av} = \frac{1}{n}\sum_{i=1}^{n} x_i$$

II Application Embodiment

The foregoing embodiments can be completely or partially replaced by software, hardware, firmware and any combination thereof. When realizing completely or partially with a computer program product, the computer program product comprises one or more computer instructions. When loading or executing the foregoing computer program instructions, the process or functions according to embodiments of the present invention can be fully or partially produced. The computer can be a general computer, a special computer, a computer network or other programmable devices. The computer instructions can be stored in a computer readable storage medium, or be transmitted from a computer readable storage medium to another computer readable storage medium, for example, the computer instructions can be transmitted by wires (by coaxial cables, optical fibre cables or data subscriber lines) or wirelessly (such as infrared, wirelessly or microwave) from a network station, computer, server or data center to another network station, computer, server or data center. The computer readable storage medium can be any available medium that the computer can store and access or comprises any data storage device such as a server or data center integrating one or more available media. The available media can be magnetic media (for example, soft disks, hard disks or magnetic tapes), optical media (such as DVD) or semiconductor media (such as solid state disks).

III Evidence with Regard to the Technical Effects of the Embodiments

Figure 6:
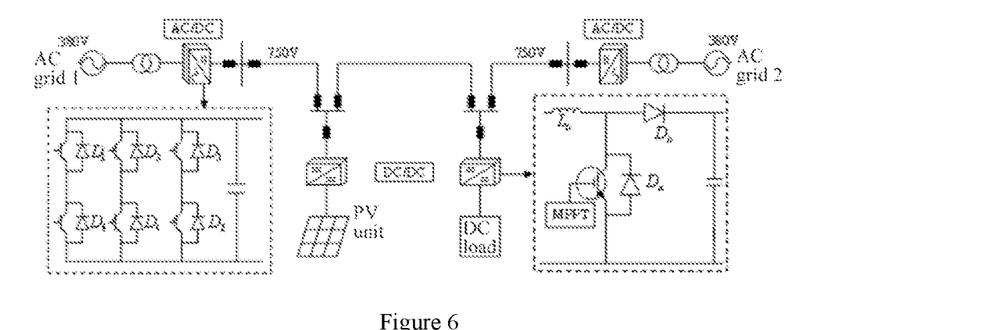
FIG. 6 is a diagram showing typical structures of the two-level VSC-type photovoltaic-connected bidirectional flexible DC distribution network according to an embodiment of the present invention.

A simulation model of the two-level VSC-type photovoltaic-connected bidirectional flexible DC distribution network is built in Matlab or Simulink as shown in FIG. 6, the simulation parameters are shown in table 1, the length of the DC power distribution lines are respectively T-VSC1: 3 km, T-VSC2: 2 km and T-DC/DC: 0.5 km.

TABLE 1

Simulation model parameters

| Parameter | Value | Parameter | Value |
|---|---|---|---|
| DC side voltage /V | 750 | VSC1power/kW | 32 |
| Equivalent inductance at AC1 side/mH | 0.8 | Equivalent resistance at AC1 side/Ω | 0.26 |
| Capacitance at DC bus side of VSC1/μF | 4400 | VSC2 power/kW | 32 |
| Equivalent inductance at AC2 side mH | 0.8 | Equivalent resistance at AC2 side/Ω | 0.14 |
| Capacitance at DC bus side of VSC2/μF | 4400 | Capacitance at PV power side/mF | 0.1 |
| Inductance at PV bus side/μF | 4400 | DC/DC capacitance/mH | 5 |
| DC line resistance Ω/km | 0.01 | DC line inductance mH/km | 0.2 |
| DC load/Ω | 10 | Small current window φ | 30 |

The line sections T-VSC1, T-VSC2, T-DC/DC are selected for researches, and outputs of the convertors are used as reference points. According to current literatures, the transitional resistances for the bipolar short-circuit fault are set to be respectively: 0.001 Ω, 0.01 Ω, 0.1Ω and 0.5Ω. The distances to the fault for the line section T-VSC1 are set to be: 0.2 km, 1 km, 2 km and 3 km, the distances to the fault for the line section T-VSC2 are set to be: 0.2 km, 1 km, 1.5 km and 2 km, and the distances to the fault for the line section T-DC/DC are set to be: 0.2 km, 0.35 km and 0.5 km. In the meanwhile, temperature changes have little influence on transient outputs of PV, therefore, the temperature is set to be constant during the fault period, which is 25° C. The light strength is set to be: 1000 W/m² for the line section T-VSC1, 800 W/m² for the line section T-VSC2, and 600 W/m² for the line section T-DC/DC. By the foregoing configurations totally 44 fault conditions are obtained, and simulation verification is conducted for each of the 44 fault conditions. When the current of the DC circuit reaches three times of the rated current, turn off the IGBTs immediately. Set the sampling frequency to be 20 kHz, the location errors can be calculated as per the following equation, and the distance measurement results of the bipolar short-circuit fault are shown in table 2.

$$\text{error} = \frac{|\text{actual position} - \text{calculated position}|}{\text{full line length}} \times 100\%$$

TABLE 2 fault location simulation results

| Illumination strength | Fault position | Transitional resistance $R_f/\Omega$ | Fault distance/m | Data window length | Location result/m | Relative error/% |
|---|---|---|---|---|---|---|
| 1000 W/m² | T-VSC1 | 0.001 | 200 | 0.175 | 199.06 | 0.019 |
| | | | 1000 | 0.52 | 992.14 | 0.157 |
| | | | 2000 | 0.965 | 2009.31 | 0.186 |
| | | | 3000 | 1.235 | 2996.12 | 0.078 |
| | | 0.01 | 200 | 0.145 | 193.64 | 0.127 |
| | | | 1000 | 0.525 | 998.63 | 0.027 |
| | | | 2000 | 0.95 | 1999.88 | 0.002 |
| | | | 3000 | 1.21 | 2994.1 | 0.118 |
| | | 0.1 | 200 | 0.235 | 196.89 | 0.062 |
| | | | 1000 | 0.65 | 998.63 | 0.027 |
| | | | 2000 | 0.99 | 2001.22 | 0.024 |
| | | | 3000 | 1.49 | 2991.83 | 0.163 |
| | | 0.5 | 200 | 0.445 | 192.48 | 0.150 |
| | | | 1000 | 1.09 | 1002.93 | 0.059 |
| | | | 2000 | 1.855 | 2000.34 | 0.007 |
| | | | 3000 | 2.24 | 2996.5 | 0.07 |
| 800 W/m² | T-VSC2 | 0.001 | 200 | 0.145 | 194.22 | 0.116 |
| | | | 1000 | 0.57 | 1000.14 | 0.003 |
| | | | 1500 | 0.8 | 1499.84 | 0.003 |
| | | | 2000 | 0.935 | 1996.71 | 0.066 |
| | | 0.01 | 200 | 0.155 | 198.93 | 0.021 |
| | | | 1000 | 0.495 | 1000.32 | 0.006 |
| | | | 1500 | 0.785 | 1500.06 | 0.001 |
| | | | 2000 | 1.035 | 1997.88 | 0.043 |
| | | 0.1 | 200 | 0.235 | 204.69 | 0.094 |
| | | | 1000 | 0.535 | 1001.14 | 0.023 |
| | | | 1500 | 0.925 | 1499.28 | 0.014 |
| | | | 2000 | 1.205 | 1997.43 | 0.051 |
| | | 0.5 | 200 | 0.475 | 197.92 | 0.042 |
| | | | 1000 | 1.19 | 999 | 0.02 |
| | | | 1500 | 1.765 | 1501.5 | 0.03 |
| | | | 2000 | 2.68 | 1992.5 | 0.15 |

TABLE 2-continued fault location simulation results

| Illumination strength | Fault position | Transitional resistance $R_f/\Omega$ | Fault distance/m | Data window length | Location result/m | Relative error/% |
|---|---|---|---|---|---|---|
| 600 W/m² | T-DC/DC | 0.001 | 200 | 0.147 | 194.22 | 0.116 |
| | | | 350 | 0.158 | 346.22 | 0.076 |
| | | | 500 | 0.167 | 496.24 | 0.075 |
| | | 0.01 | 200 | 0.164 | 198.93 | 0.021 |
| | | | 350 | 0.169 | 347.34 | 0.053 |
| | | | 500 | 0.185 | 498.21 | 0.036 |
| | | 0.1 | 200 | 0.227 | 204.69 | 0.094 |
| | | | 350 | 0.239 | 354.18 | 0.084 |
| | | | 500 | 0.252 | 494.35 | 0.113 |
| | | 0.5 | 200 | 0.486 | 197.92 | 0.042 |
| | | | 350 | 0.506 | 347.65 | 0.047 |
| | | | 500 | 0.614 | 498.12 | 0.038 |

As can be seen from table 2, the distance measurement method proposed in the present invention has high distance measurement precision. Furthermore, with the change of the transitional resistance and the distance to the fault, the distance measurement accuracy may fluctuate slightly, however, the biggest relative error does not go beyond 0.2%, which establishes the effectiveness and accuracy of the fault location method proposed in the present invention.

Figure 7:
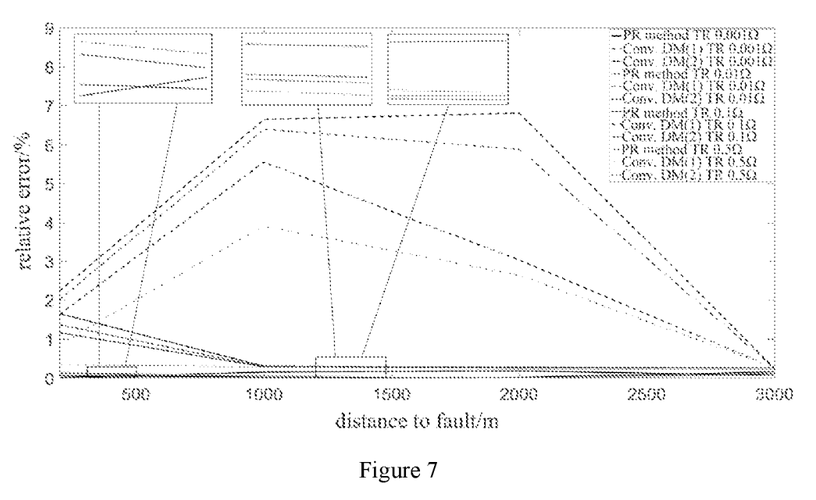
FIG. 7 is a comparison diagram showing relative errors of different distance measurement methods provided in an embodiment of the present invention; In the drawings: 1. Fault occurrence segment judging module; 2. Fault distance model building module; 3. Fault distance calculation module; and 4. Short circuit fault location module. And in FIG. 7, PR method means the parameter recognition method, TR is transitional resistance, and conv. DM means conventional distance measurement method.

Furthermore, take as an example that the fault occurs in between the T-VSC1, the illumination strength is 1000 W/m², configure the transitional resistances of the bipolar short-circuit fault to be respectively: 0.001 Ω, 0.01 Ω, 0.1Ω and 0.5Ω and the distances to the fault: 0.2 km, 1 km, 2 km and 3 km, compare the location accuracy of conventional distance measurement methods and the distance measurement method according to the present invention, the conventional distance measurement methods (1) have neglected the location method of flexible DC distribution networks fed by the photovoltaic system. The conventional distance measurement methods (2) are location methods of flexible DC distribution network based on RLC differentiation equation. A comparison of relative errors of different distance measurement methods is given in table 3, wherein the relative errors are shown in FIG. 7.

Compared with the two conventional distance measurement methods, the distance measurement method as proposed in the present invention has obtained location results of higher accuracy at different transitional resistances and distances to the fault and is of high stability. In the meanwhile, high precision can be promised even in a short data window, and a low requirement is placed on sampling frequency.

The foregoing are only some specific embodiments of the present invention, however, the protection scope of the present invention is not limited thereto, any modification, equivalent replacement or modification made by those skilled in the art within the technical scope disclosed in the present invention shall be covered in the protection scope of the present invention.

The invention claimed is:

1. A fault location method for two-level VSC type photovoltaic connected flexible DC distribution network, wherein the fault location method for two-level VSC-type photovoltaic connected flexible DC distribution network comprising:
   recognizing a section where a fault lie from a direction of positive current of DC feeders during a fault period;
   establishing a distance measuring model for bipolar

TABLE 3 location accuracy comparison of different distance measurement methods

| Transitional resistance $R_f/\Omega$ | Fault distance/m | Parameter recognition method location result/m | Relative error/% | Conventional method 1 location result/m | Relative error/% | Conventional method location result/m | Relative error/% |
|---|---|---|---|---|---|---|---|
| 0.001 | 200 | 199.06 | 0.019 | 88.07 | 2.239 | 282.86 | 1.657 |
| | 1000 | 992.14 | 0.157 | 667.36 | 6.653 | 984.69 | 0.306 |
| | 2000 | 2009.31 | 0.186 | 1659.13 | 6.817 | 2014.17 | 0.283 |
| | 3000 | 2996.12 | 0.078 | 3012.67 | 0.253 | 3012.94 | 0.259 |
| 0.01 | 200 | 193.64 | 0.127 | 99.35 | 2.013 | 268.57 | 1.371 |
| | 1000 | 998.63 | 0.027 | 679.9 | 6.402 | 1014.55 | 0.291 |
| | 2000 | 1999.88 | 0.002 | 1705.65 | 5.887 | 1987.32 | 0.254 |
| | 3000 | 2994.1 | 0.118 | 3012.45 | 0.249 | 3012.82 | 0.256 |
| 0.1 | 200 | 196.89 | 0.062 | 118.21 | 1.636 | 258.4 | 1.168 |
| | 1000 | 998.63 | 0.027 | 721.92 | 5.562 | 985.52 | 0.290 |
| | 2000 | 2001.22 | 0.024 | 1848.75 | 3.025 | 2013.21 | 0.264 |
| | 3000 | 2991.83 | 0.163 | 2986.83 | 0.263 | 2987.3 | 0.254 |
| 0.5 | 200 | 192.48 | 0.150 | 156.79 | 0.864 | 217.63 | 0.353 |
| | 1000 | 1002.93 | 0.059 | 804.35 | 3.913 | 985.65 | 0.287 |
| | 2000 | 2000.34 | 0.007 | 1868.15 | 2.637 | 2012.15 | 0.243 |
| | 3000 | 2996.5 | 0.07 | 3013.53 | 0.271 | 3012.1 | 0.242 | short circuit covering interactions and responses of systems according to equivalent circuits of transient periods during the fault period; and realizing fault location by finding a distance to fault with electric parameters and information of the fault, wherein the fault location method of two-level VSC-type photovoltaic connected bidirectional flexible DC distribution network comprising the following steps:

(Step 1), assuming a T point is an intersection between a DC feeder of at least one at least one photovoltaic sub-system and a DC feeder of at least one At least one AC sub-system, judging the section where the fault occurs according to the direction of the positive current of the DC feeders at the T point during the fault period:

(Step 2), establishing a distance measurement model for the bipolar short circuit fault covering the interactions and responses between the systems by the equivalent circuits of transient periods during bipolar short circuit of the two-level VSC type flexible DC distribution network; and (Step 3), determining a length of a sampling window according to boundary conditions of the transient periods of the fault, calculating the distance to the fault based on electric parameters and information of the fault at sampling times; calculating average values of the distance to the fault obtained at the sampling points and realizing accurate location of the bipolar short circuit fault, wherein in the step 1, a direction from convertors of the At least one AC sub-system or the at least one photovoltaic sub-system to a DC circuit is a positive direction, $i_{VSC1}$, $i_{VSC2}$, $i_{DC/DC}$ are respectively positive currents between the T point and output of VSC1, VSC2 and DC/DC at the T point, if during the fault period, $i_{VSC1}$ is negative, the fault is located in between the VSC1 and the T point; if during the fault period, $i_{VSC2}$ is negative, the fault is located in between the VSC2 and the T point; and if during the fault period $i_{DC/DC}$ is negative, the fault is located in between the DC/DC and the T point.

2. A fault location method for two-level VSC type photovoltaic connected flexible DC distribution network, wherein the fault location method for two-level VSC-type photovoltaic connected flexible DC distribution network comprising:

recognizing a section where a fault lie from a direction of positive current of DC feeders during a fault period;

establishing a distance measuring model for bipolar short circuit covering interactions and responses of systems according to equivalent circuits of transient periods during the fault period; and realizing fault location by finding a distance to fault with electric parameters and information of the fault, wherein the fault location method of two-level VSC-type photovoltaic connected bidirectional flexible DC distribution network comprising the following steps:

(Step 1), assuming a T point is an intersection between a DC feeder of at least one at least one photovoltaic sub-system and a DC feeder of at least one At least one AC sub-system, judging the section where the fault occurs according to the direction of the positive current of the DC feeders at the T point during the fault period;

(Step 2), establishing a distance measurement model for the bipolar short circuit fault covering the interactions and responses between the systems by the equivalent circuits of transient periods during bipolar short circuit of the two-level VSC type flexible DC distribution network; and (Step 3), determining a length of a sampling window according to boundary conditions of the transient periods of the fault, calculating the distance to the fault based on electric parameters and information of the fault at sampling times; calculating average values of the distance to the fault obtained at the sampling points and realizing accurate location of the bipolar short circuit fault, wherein in the step 2, after occurrence of the fault, turning off immediately IGBTs of the convertors of the sub-systems, analyzing coupling relationships of each of the subsystems at a fault point during the fault period according to conduction and feeding conditions of internal diodes in two-level VSCs and photovoltaic DC/DC, determining boundary conditions and the equivalent circuits of the transient stages during the bipolar short circuit fault; building a corresponding fault mode equation based on Kirchhoff's laws; expressing elements in the fault mode equation that change along with the distance to the fault and transitional resistance and establishing a bipolar short circuit fault distance measurement mode equation containing the distance to the fault and the transitional resistance.

* * * * *